(12) United States Patent
Lee et al.

(10) Patent No.: US 8,593,060 B2
(45) Date of Patent: Nov. 26, 2013

(54) MULTI-DISPLAY APPARATUS AND METHODS THEREOF

(75) Inventors: Young-gu Lee, Yongin-si (KR); In-seo Kee, Yongin-si (KR); Ick-hwan Ko, Yongin-si (KR); Hong-shik Shim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 653 days.

(21) Appl. No.: 11/851,748

(22) Filed: Sep. 7, 2007

(65) Prior Publication Data

US 2008/0203907 A1    Aug. 28, 2008

(30) Foreign Application Priority Data

Feb. 23, 2007    (KR) .................. 10-2007-0018522

(51) Int. Cl.
*H05B 33/04*    (2006.01)
(52) U.S. Cl.
USPC .................................. 313/512; 445/25
(58) Field of Classification Search
USPC ............... 257/40, 72, 98–100, 642–643, 759; 313/582–587, 495–512; 427/58, 64, 427/66, 532–535, 539; 428/690–691, 917; 438/26–29, 34, 82; 315/169.1, 169.3; 345/1.3, 3.1, 5; 445/24–25
See application file for complete search history.

(56) References Cited

U.S. PATENT DOCUMENTS

| | | | |
|---|---|---|---|
| 6,104,457 A | 8/2000 | Izumi et al. | |
| 6,177,912 B1 * | 1/2001 | Izumi | ............................. 345/1.3 |
| 6,268,695 B1 | 7/2001 | Affinito | |
| 6,413,645 B1 | 7/2002 | Graff et al. | |
| 6,483,482 B1 * | 11/2002 | Kim | ................................ 345/3.1 |
| 6,624,568 B2 | 9/2003 | Silvernail | |
| 6,998,217 B2 | 2/2006 | Martyniuk et al. | |
| 7,132,694 B2 * | 11/2006 | Mochizuki | ..................... 257/91 |
| 7,570,483 B2 * | 8/2009 | Kim | ......................... 361/679.26 |
| 2002/0140347 A1 * | 10/2002 | Weaver | ......................... 313/506 |
| 2004/0099305 A1 * | 5/2004 | Heller | ........................... 136/263 |
| 2004/0195967 A1 | 10/2004 | Padiyath et al. | |

(Continued)

FOREIGN PATENT DOCUMENTS

EP    0859539 A2    8/1998
JP    2001-284041 A    10/2001

(Continued)

OTHER PUBLICATIONS

Korean Office Action for Korean patent application No. 10-2007-0018522 dated May 28, 2013 with English Translation.

*Primary Examiner* — Donald Raleigh
(74) *Attorney, Agent, or Firm* — Cantor Colburn LLP

(57) ABSTRACT

A multi-display apparatus includes a thin film encapsulating structure to prevent moisture penetration through sides of the encapsulating structure. Each of a plurality of unit panels of the multi-display apparatus includes a substrate, a display device formed on the substrate, an organic material layer formed on the substrate to bury the display device, an inorganic material layer stacked on the organic material layer, and a moisture barrier wall that is formed outside the display device on the substrate and has a height greater than a thickness of the organic material layer. The multi-display apparatus having a thin film encapsulating structure can realize a stable, smooth, and large image screen since the thin film encapsulating structure can reduce a width of seams between the unit panels and can prevent moisture penetration.

15 Claims, 4 Drawing Sheets

(56) References Cited

U.S. PATENT DOCUMENTS

| | | |
|---|---|---|
| 2005/0012445 A1* | 1/2005 | Yamazaki et al. ............ 313/500 |
| 2005/0140282 A1* | 6/2005 | Park et al. .................... 313/505 |
| 2005/0170210 A1* | 8/2005 | Kim et al. .................... 428/690 |
| 2005/0275342 A1* | 12/2005 | Yanagawa .................... 313/504 |
| 2006/0061272 A1* | 3/2006 | McCormick et al. ......... 313/512 |
| 2006/0077116 A1* | 4/2006 | Chen et al. .................... 345/1.1 |
| 2007/0013292 A1* | 1/2007 | Inoue et al. ................... 313/504 |
| 2007/0046184 A1* | 3/2007 | Chiang et al. ................. 313/504 |
| 2007/0105255 A1* | 5/2007 | Nishimura .................... 438/34 |
| 2007/0164666 A1* | 7/2007 | Oosono et al. ............... 313/504 |
| 2008/0018244 A1* | 1/2008 | Anandan ....................... 313/511 |

FOREIGN PATENT DOCUMENTS

| | | |
|---|---|---|
| JP | 2002-297063 A | 10/2002 |
| JP | 2002-297064 A | 10/2002 |
| KR | 100257814 B1 | 3/2000 |
| KR | 1020000039481 A | 7/2000 |
| KR | 1020020039891 A | 5/2002 |
| KR | 1020050094898 A | 9/2005 |
| KR | 1020060060259 A | 6/2006 |
| WO | WO 2006129892 A1 * | 12/2006 |

\* cited by examiner

US 8,593,060 B2

MULTI-DISPLAY APPARATUS AND METHODS THEREOF

This application claims priority to Korean Patent Application No. 10-2007-0018522, filed on Feb. 23, 2007, and all the benefits accruing therefrom under 35 U.S.C. §119, the contents of which in its entirety are herein incorporated by reference.

BACKGROUND OF THE INVENTION

1. Field of the Invention

The present invention relates to a multi-display apparatus and methods thereof, and more particularly, to a multi-display apparatus that can display a stable, smooth, high quality image, a method of manufacturing the multi-display apparatus, and a method of improving the multi-display apparatus.

2. Description of the Related Art

Conventionally, multi-display apparatuses realize a large screen by connecting a plurality of display panels. In the past, a large screen was realized by connecting a plurality of Braun tubes, also known as cathode ray tubes ("CRTs"), to form a large TV. However, recently, due to the increasing demand for a large screen in small mobile apparatuses such as mobile phones or personal digital assistants ("PDAs"), apparatuses that realize a large screen by connecting flat panel displays, such as liquid crystal displays ("LCDs"), field emission displays ("FEDs"), plasma display panels ("PDPs"), and organic light-emitting diodes ("OLEDs"), are being produced.

Multi-display apparatuses are manufactured by connecting a plurality of unit panels end to end in parallel. FIG. 1 is a cross-sectional view of a conventional multi-display apparatus of the prior art including two unit panels 10. There are various ways of connecting the two unit panels 10. Recently, for convenience of transportation, a foldaway connection structure using hinges has been employed to connect unit panels in a multi-display apparatus.

However, when the two unit panels 10 are connected, if a width w of a seam between the two unit panels 10 is too wide, an image at the seam is not smoothly formed but viewed as disconnected. That is, as schematically depicted in FIG. 1, a flat panel display panel includes a sealing structure in which a display device 12 is mounted on a substrate 11 and glass 13 is attached to the substrate 11 using an adhesive. The glass 13 generally has a rim thickness t of approximately 1 mm, and thus, when the two unit panels 10 are connected, the width w of the seam is at least 2 mm. Usually, when the width of the connection part of the image is less than 1.0 mm, a smoothly connected image can be viewed. Accordingly, if the width of the connection part is 2 mm, which exceeds 1 mm, the image quality is reduced.

However, when the rim thickness t of the glass 13 is excessively reduced, there is a high possibility that gaps will be formed between the substrate 11 and the glass 13 if there is a slight processing error, and thus moisture can penetrate into the display device 12, and also, when the glass 13 is attached to the substrate 11 using the adhesive, the adhesive can be pushed towards the display device 12 causing malfunction of pixels.

As depicted in FIG. 2, instead of the glass 13, a thin film encapsulating structure in which the display device 12 is surrounded by a plurality of thin film layers to protect the display device 12 has been disclosed. The aim of the thin film encapsulating structure is to protect the display device 12 from impact and moisture penetration by alternately stacking flexible organic material layers 21 and inorganic material layers 22 having a high moisture proofing characteristic. Using the thin film encapsulating structure, the width of the connection part can be reduced since the end portion of the connection part does not require a minimum thickness limitation unlike the glass 13. However, the layer that directly contacts the display device 12 must be one of the organic material layers 21, which have a poor moisture proofing characteristic, to protect the display device 12 from impact. That is, when the conventional glass 13 is used, there is a space between the glass 13 and the display device 12, thus, although there is an impact on the glass 13, the impact is not directly transmitted to the display device 12. However, in the case of the thin film encapsulating structure, an external impact can be directly transmitted to the display device 12. Therefore, in order to secure a buffer function, the display device 12 is buried in the organic material layer 21 as depicted in FIG. 3.

BRIEF SUMMARY OF THE INVENTION

The present invention provides a multi-display apparatus that reduces a width of a seam between display devices of the multi-display apparatus to display a natural image and prevents the penetration of moisture into the display devices.

According to exemplary embodiments of the present invention, there is provided a multi-display apparatus including a plurality of unit panels connected to form an image screen, each unit panel including a substrate, a display device formed on the substrate, an organic material layer formed on the substrate to bury the display device, an inorganic material layer stacked on the organic material layer, and a moisture barrier wall that is formed outside the display device on the substrate and has a height greater than a thickness of the organic material layer.

The multi-display apparatus may further include at least one additional organic material layer and at least one additional inorganic material layer alternately stacked.

An angle between a wall surface of the moisture barrier wall and a surface of the substrate, upon which the moisture barrier wall is formed, may be about 90° or less.

The moisture barrier wall may be formed of an inorganic material or an organic material having a moisture penetration rate of $10^{-4}$ g·cm$^3$/day or less, such as epoxy resin.

The display device may be one of a liquid crystal display ("LCD"), a field emission display ("FED"), a plasma display panel ("PDP"), and an organic light-emitting diode ("OLED").

In realizing a large image screen by connecting two unit panels, the two unit panels each having the moisture barrier wall may be connected in a foldaway connection structure in which two ends of the unit panels contact each other, or in another foldaway connection structure in which two ends of the unit panels are disposed up and down with a step difference therebetween so that the display devices of the two unit panels are viewed as if they are consecutively connected with a gap equivalent to a width of one pixel.

The height of the moisture barrier wall may be greater than a combined thickness of the organic material layer and the inorganic material layer.

A portion of the organic material layer may be formed between the moisture barrier wall and the display device. An outer wall surface of the moisture barrier wall may be substantially coplanar with side surfaces of the substrate.

According to other exemplary embodiments of the present invention, a method of manufacturing a unit panel for a multi-display apparatus includes forming a display device on a substrate, forming a moisture barrier wall on the substrate spaced from and surrounding an outer periphery of the display device, depositing an organic material layer within an area defined by the moisture barrier wall to a height less than a height of the moisture barrier wall, the organic material layer covering the display device, and depositing an inorganic material layer on the organic material layer and contacting the moisture barrier wall.

The method may further include alternately depositing additional organic material layers and inorganic material layers.

Forming a moisture barrier wall on the substrate may include forming an outer wall surface of the moisture barrier wall to be substantially coplanar with side surfaces of the substrate.

According to still other exemplary embodiments of the present invention, a method of improving a multi-display apparatus includes protecting a display device of at least one unit panel in the multi-display apparatus from moisture, by disposing the display device on a substrate, surrounding the display device with a thin film encapsulating structure including an organic material layer burying the display device and an inorganic material layer overlapping the organic material layer, and providing a moisture barrier wall on the substrate in contact with the organic material layer and the inorganic material layer.

The method may further include limiting a width between display devices of adjacent unit panels to less than about 1.0 mm.

Surrounding the display device with the thin film encapsulating structure includes interposing a portion of the organic material layer between the display device and the moisture barrier wall.

Providing the moisture barrier wall on the substrate includes forming a wall surface of the moisture barrier wall facing the display device to be at an angle of about 90 degrees or less with respect to a surface of the substrate upon which the display device is disposed.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
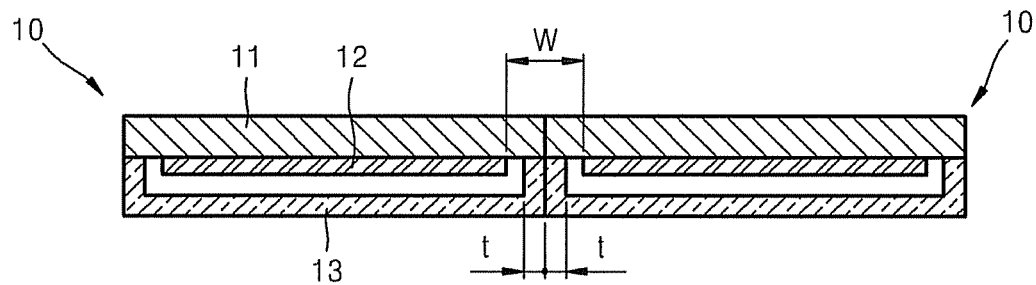
FIG. 1 is a cross-sectional view of a conventional multi-display apparatus of the prior art.

The present invention will now be described more fully with reference to the accompanying drawings in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Figure 2:
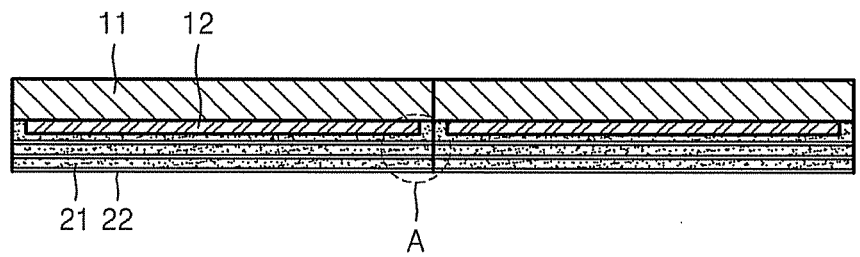
FIG. 2 is a cross-sectional view of another conventional multi-display apparatus of the prior art.
Figure 3:
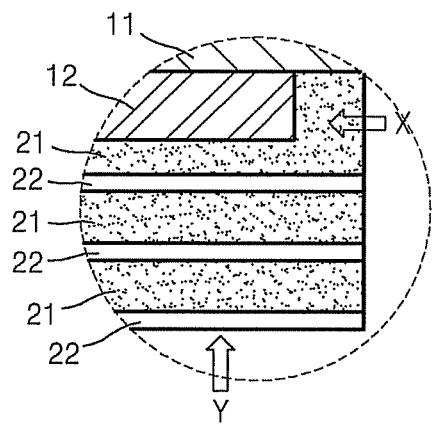
FIG. 3 is a magnified cross-sectional view of portion A of the conventional multi-display apparatus of the prior art illustrated in FIG. 2.

FIG. 3 is a magnified cross-sectional view of portion A of the conventional multi-display apparatus of the prior art illustrated in FIG. 2. In this case, the moisture penetration in a Y direction can be prevented by the inorganic material layers 22. However, it is herein noted that moisture can readily laterally penetrate into the display device 12, that is, in an X direction. That is, there is a high possibility that the display device 12 can be readily degraded since moisture penetrated into the thin film encapsulating structure in the X direction can reach the display device 12 without blocking by the inorganic material layer 22. In practice, when the thin film encapsulating structure is used for a period of time, it is herein observed that pixels near edges of the display devices 12 begin to degrade.

Accordingly, to display a stable and natural image, the present invention provides a new multi-display apparatus that can prevent the penetration of moisture into display devices and overcome the image disconnection problem at seams between the display devices.

Hereinafter, the present invention will be described in detail with reference to the accompanying drawings.

Figure 4:
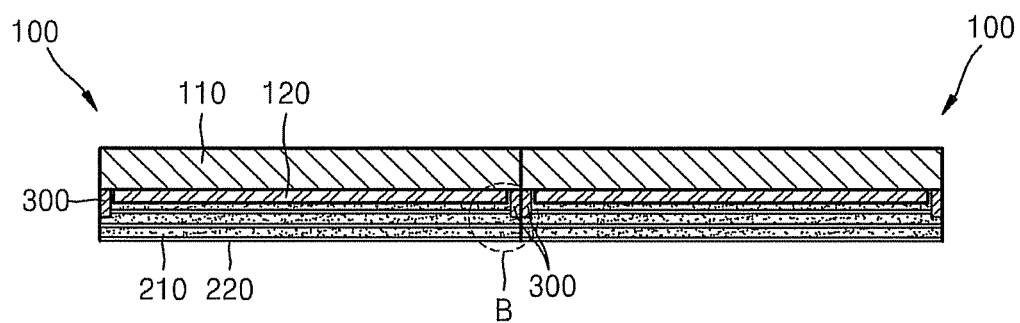
FIG. 4 is a cross-sectional view of an exemplary multi-display apparatus according to an exemplary embodiment of the present invention.
Figure 5:
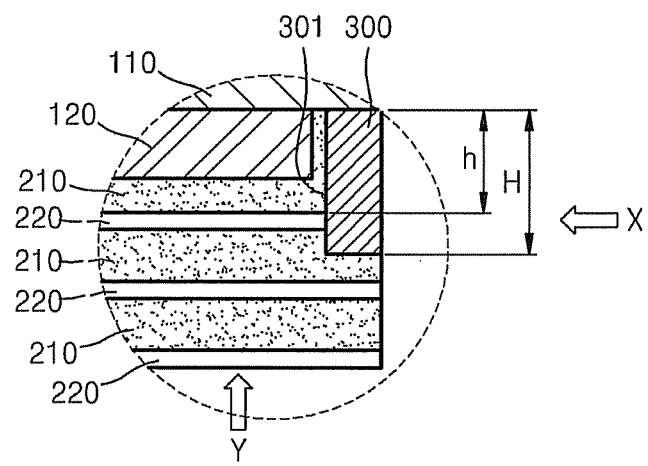
FIG. 5 is a magnified cross-sectional view of portion B of the exemplary multi-display apparatus illustrated in FIG. 4, according to an exemplary embodiment of the present invention.
Figure 6:
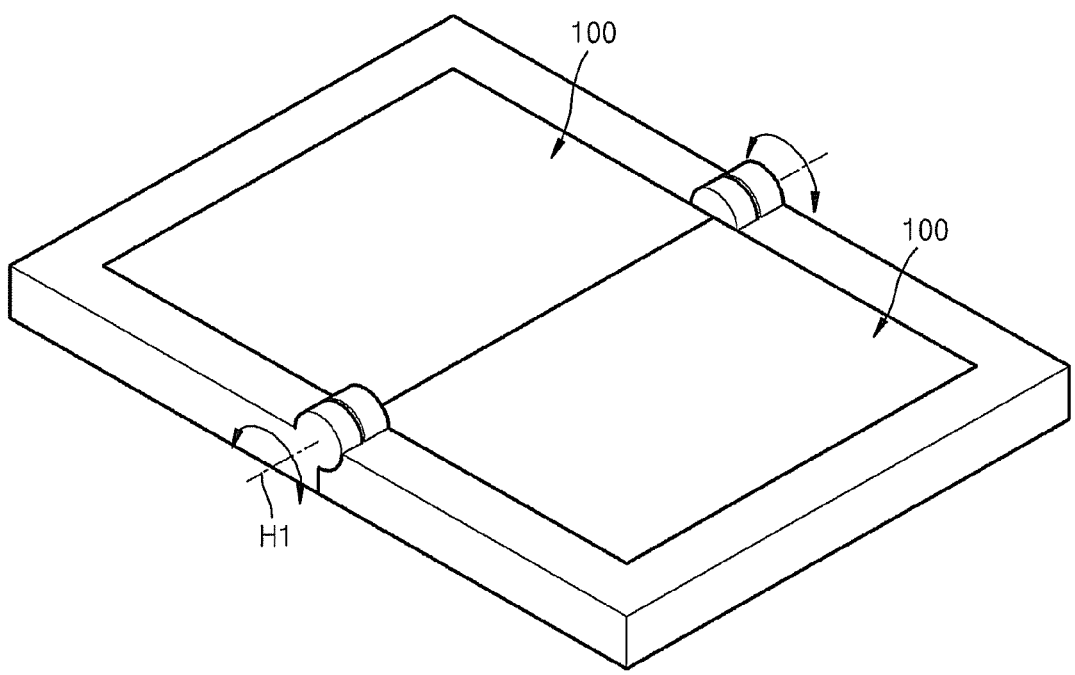
FIG. 6 is a perspective view of the exemplary multi-display apparatus of FIG. 4 having an exemplary foldaway connection structure, according to an exemplary embodiment of the present invention.

FIG. 4 is a cross-sectional view of an exemplary multi-display apparatus according to an exemplary embodiment of the present invention. FIG. 5 is a magnified cross-sectional view of portion B of the exemplary multi-display apparatus illustrated in FIG. 4. FIG. 6 is a perspective view of the exemplary multi-display apparatus of FIG. 4 having an exemplary foldaway connection structure, according to an exemplary embodiment of the present invention. The multi-display apparatus may include any number of unit panels; however, for convenience of description, two unit panels will be described. Also, the multi-display apparatus can be manufactured using various methods; however, in the exemplary embodiments described herein, a foldaway connection structure in which two unit panels are connected will be described. Furthermore, for convenience of description, display devices are depicted in a simplified form.

Referring to FIGS. 4 through 6, the multi-display apparatus according to an exemplary embodiment of the present invention includes two unit panels 100 each including a display device 120. Each of the unit panels 100 basically includes a thin film encapsulating structure in which the display device 120 formed on a substrate 110 is protected by being buried in an organic material layer 210, an inorganic material layer 220 having a high moisture proofing characteristic is stacked on the organic material layer 210, and the organic material layers 210 and the inorganic material layers 220 are repeatedly and alternately stacked. Accordingly, in an exemplary embodiment, the thin film encapsulating structure does not include glass unlike in the prior art, and an image formed by the display device 120 may be displayed through the substrate 110. Referring to FIG. 5, typically, each of the organic material layers 210 has a thickness h of about 0.01 to about 10 μm, and each of the inorganic material layers 220 has a thickness of approximately 1/10 of the thickness h of the organic material layer 210.

As depicted in FIG. 6, two unit panels 100 form a wide screen by being connected in a foldaway connection structure that can be opened and closed with respect to a hinge axis H1, and when the two unit panels 100 are opened, as depicted in FIG. 4, seam end portions of the two unit panels 100 contact each other.

In the present invention, in order to protect the display device 120 from moisture penetration through the thin film encapsulating structure by preventing moisture from penetrating through the thin film encapsulating structure, a moisture barrier wall 300 is formed on an edge of each of the unit panels 100. That is, in the thin film encapsulating structure as depicted in FIG. 5, since moisture that laterally penetrates the thin film encapsulating structure (in an X direction) can reach the display device 120 through the organic material layer 210 in which the display device 120 is buried, the moisture barrier wall 300 having a height H greater than the height thickness h of the organic material layer 210 is formed. The moisture barrier wall 300 may be formed on the substrate 110, may be spaced from the display device 120 by a first organic material layer 210 that buries the display device 120 therein, and may surround the display device 120 like a frame. Due to the moisture barrier wall 300, moisture cannot reach the display device 120, and also, the inorganic material layer 220 having a high moisture proofing characteristic prevents the moisture penetrating to the display device 120, thereby overcoming the conventional problem of lateral moisture penetration into the thin film encapsulating structure.

The moisture barrier wall 300 may be formed of a nitride, oxide, or carbide such as $SiN_x$, $Al_2O_3$, $SiO_2$, or $TiO_2$, which may be similar materials used to form the inorganic material layer 220. Since the purpose of the moisture barrier wall 300 is to protect the display device 120 from moisture penetration, the moisture barrier wall 300 can be formed of a material similar to that used to form the inorganic material layer 220 to provide a moisture proofing characteristic.

In alternative exemplary embodiments, the moisture barrier wall 300 may be formed of an organic material. In this case, since polyurea or polyacrylate which may be used to form the organic material layer 210 does not have an appropriate moisture proofing function, an organic material having a moisture penetration rate of about $10^{-4}$ g·cm$^3$/day or less, for example, epoxy resin may be used.

Figure 7A:
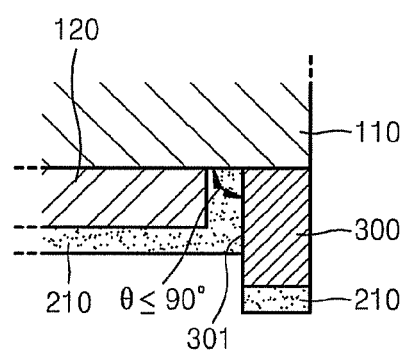
FIGS. 7A and 7B are cross-sectional views for explaining the effect of moisture penetration according to wall angles of exemplary moisture barrier walls of an exemplary unit panel of the exemplary multi-display apparatus of FIG. 4, according to an exemplary embodiment of the present invention.

When the moisture barrier wall 300 is formed on the substrate 110, an angle θ between a wall surface 301 of the moisture barrier wall 300 facing the display device 120 and a bottom surface of the substrate 110 may be about 90°. This is because if the angle θ exceeds 90°, an end of the organic material layer 210 in which the display device 120 is buried can extend over the moisture barrier wall 300. Therefore, if the angle θ is about 90° or less as depicted in FIG. 7A, when a first organic material layer 210 is formed on the display device 120, an upper surface of the moisture barrier wall 300, a surface furthest from the substrate 110, is not covered by the first organic material layer 210 in which the display device 120 is buried. The organic material layer 210 is usually formed by attaching organic material particles to the substrate 110, the display device 120, and the moisture barrier wall 300 using a deposition process such as a polymer deposition method or an ultraviolet ray hardening method. At this point, if the angle θ between the wall surface 301 and the bottom surface of the substrate 110 is about 90° or less, the organic material particles cannot be attached to the upper part of the wall surface 301 of the moisture barrier wall 300, that is, beyond the thickness of the first organic material layer 210. Afterwards, the inorganic material layer 220 that contacts an upper part of the wall surface 301 of the moisture barrier wall 300 is formed on the organic material layer 210. Accordingly, moisture that penetrates the thin film encapsulating structure through an end portion of the seam must penetrate at least one of the moisture barrier wall 300 and the inorganic material layer 220 to reach the display device 120. In other words, the display device 120 is safely protected from moisture penetration.

Figure 7B:
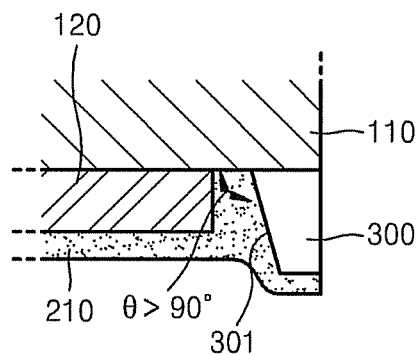

However, as depicted in FIG. 7B, if the angle θ between the wall surface 301 and the bottom surface of the substrate 110 exceeds 90°, the organic material layer 210 may extend over the moisture barrier wall 300 due to the attachment of the organic material particles to the wall surface 301 of the moisture barrier wall 300. This structure thus includes an organic material layer 210 exposed on a lateral side of the unit panel 100, similar to the case when the moisture barrier wall 300 is not formed, and thus, the same moisture penetration problem will occur. Therefore, the angle θ between the wall surface 301 of the moisture barrier wall 300 and the bottom surface of the substrate 110 is preferably about 90° or less.

An exemplary method of manufacturing the unit panel 100 of FIGS. 4 through 6 described above is outlined as follows.

A moisture barrier wall 300 is formed on a substrate 110 on which a display device 120 is formed. The moisture barrier wall 300 can be formed such that, after depositing a material, such as nitride, oxide, or carbide, on the substrate 110 using a deposition method such as chemical vapor deposition ("CVD"), sputtering, E-beam, or thermal deposition, the material can be etched, or the moisture barrier wall 300 can be formed by performing selective deposition using a mask. The moisture barrier wall 300 may frame the display device 120 with a space between the display device 120 and the moisture barrier wall 300. An outer wall surface of the moisture barrier wall 300 may align with an outer periphery of the substrate 110. The moisture barrier wall 300 may be formed to have a height H greater than a height of the display device 120, and, as will be further described below, the height H of the moisture barrier wall 300 may also be greater than a combined height of the first organic material layer 210 and a first overlapping inorganic material layer 220, or at least a combined height of the first organic material layer 210 and a portion of the first overlapping inorganic material layer 220. An angle θ between a wall surface 301 of the moisture barrier wall 300 facing the display device 120 and a bottom surface of the substrate 110 is formed to be about 90° or less. Alternatively, the moisture barrier wall 300 may be formed of an organic material having a low moisture penetration rate such as epoxy by patterning the organic material using a photolithography process, or by patterning using an inkjet or imprinting technique.

After the moisture barrier wall 300 is formed, an organic material layer 210 is deposited to bury the display device 120, and may be considered the first organic material layer 210. At this point, the organic material layer 210 is formed to have a thickness h less than a height H of the moisture barrier wall 300. Next, an inorganic material layer 220, which may be considered a first inorganic material layer 220, is deposited on the first organic material layer 210. In an exemplary embodiment, the height H of the moisture barrier wall 300 may be greater than a combined height of the first organic material layer 210 and the first inorganic material layer 220, or at least a portion of the first inorganic material layer 220, to ensure protection of the display device 120 from moisture penetration by contacting the first inorganic material layer 220 to the moisture barrier wall 300. Afterwards, a plurality of the organic material layers 210 and the inorganic material layers 220 are alternately deposited to form a multilayer thin film encapsulating structure. The remainder of the organic material layers 210 and inorganic material layers 220 may have outer peripheries aligned with an outer wall of the moisture barrier wall 300 and the substrate 110.

The unit panels 100 manufactured using the above-described processes may be hinge coupled to each other in a foldaway connection structure so that end portions of a seam between the unit panels 100 can contact each other when the unit panels 100 are opened. As a result, the manufacture of a multi-display apparatus similar to the multi-display apparatus illustrated in FIG. 4 is completed.

Accordingly, the multi-display apparatus of the present invention basically includes a thin film encapsulating structure. Thus, a width of a seam between unit panels can be reduced compared to the prior art in which the encapsulating structure is formed using glass, and since the problem of moisture penetration through a side surface of a conventional thin film encapsulating structure is overcome by forming a moisture barrier wall, a very stable display atmosphere can be realized. In practice, as a result of using a multi-display apparatus having the moisture barrier wall, the degradation of pixels near the seam is not apparent unlike in the prior art. Accordingly, a multi-display apparatus having a smooth image at a seam between unit panels and that prevents moisture penetration can be realized.

Figure 8:
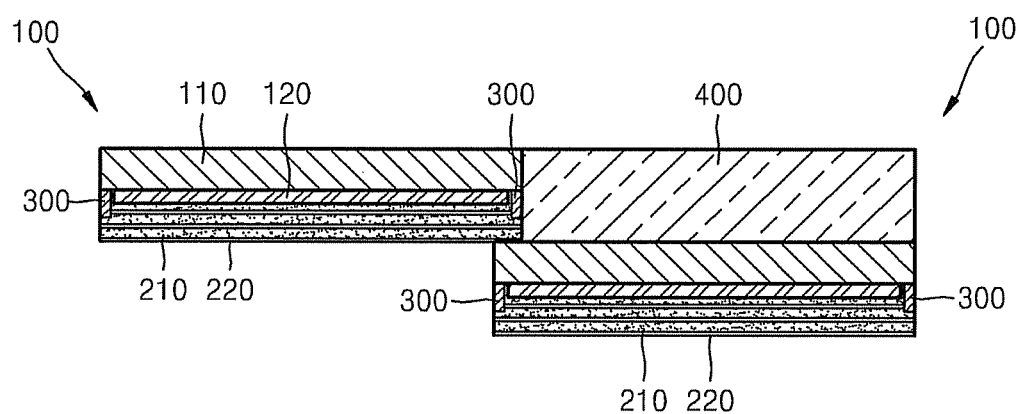
FIG. 8 is a cross-sectional view of an exemplary multi-display apparatus according to another exemplary embodiment of the present invention.

FIG. 8 is a cross-sectional view of an exemplary multi-display apparatus including two unit panels 100, according to another exemplary embodiment of the present invention. Referring to FIG. 8, the configuration of the unit panels 100 may be substantially the same as the unit panels 100 of the multi-display apparatus of FIG. 4. However, the method of connecting the two unit panels 100 in the exemplary embodiment of FIG. 8 is different from that of FIG. 4. In FIG. 4, two ends of the seam contact each other in the multi-display apparatus. However, in the exemplary embodiment of FIG. 8, when the two unit panels 100 connected in a foldaway connection structure are opened, the unit panels 100 are disposed up and down with a step difference therebetween. In other words, the unit panels 100 slightly overlap each other to align a rightmost edge of the display device 120 of a leftmost unit panel 100 and a leftmost edge of the display device 120 of a rightmost unit panel 100 along a plane perpendicular to the unit panels 100.

The purpose of the step difference between the unit panels 100 is to display a further smoothly connected image at a seam between the unit panels 100, that is, to connect both ends of the display devices 120 of the two unit panels 100 near the seam as if they are consecutively connected with a gap equivalent to the width of one pixel between the unit panels 100. In the above-described thin film encapsulating structure, even though the moisture barrier wall 300 is formed on an edge of the thin film encapsulating structure, the width of the seam does not exceed 1.0 mm although the ends of both unit panels 100 are connected in parallel because the width of the seam can be formed to a size of 500 μm or less in a deposition process. However, in the present embodiment, when the unit panels 100 are disposed in a step difference structure, the image disconnection can further be reduced. Accordingly, a further smooth image can be viewed. A transparent plate 400 is provided on a lower unit panel 100 to balance the upper surfaces of the two unit panels 100. The basic structure and method of manufacturing the multi-display apparatus of FIG. 8 may be substantially the same as those of the multi-display apparatus of FIG. 4, and thus, detailed descriptions thereof will not be repeated. The configuration of the unit panels 100 according to the exemplary embodiment described with respect to FIG. 8 allows for the manufacture of a multi-display apparatus having a further smooth image at a seam between the unit panels 100 and that prevents moisture penetration.

The display devices 120 described in the exemplary embodiments of the present invention can be any kind of flat panel display device including liquid crystal displays ("LCDs"), field emission displays ("FEDs"), plasma display panels ("PDPs"), or organic light-emitting diodes ("OLEDs").

As described above, a multi-display apparatus according to the present invention provides a reduced width of a seam between two unit panels and prevents moisture penetration, thereby realizing a very stable, smooth, and high quality image, and a large image screen. Also, an exemplary method of effectively preventing lateral moisture penetration in a multi-display apparatus includes employing a thin film encapsulation structure as described above.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A multi-display apparatus comprising
a plurality of unit panels connected to form an image screen, each unit panel comprising:
a substrate;
a display device on a first surface of the substrate;
a moisture barrier wall contacting the first surface of the substrate, wherein the moisture barrier wall is spaced from an outer periphery of the display device and exposes the display device;
an organic material layer on the substrate and burying the display device inside the moisture barrier wall; and
an inorganic material layer disposed on substantially an entire upper surface of the organic material layer,
wherein
the moisture barrier wall has a height greater than a thickness of the organic material layer,
an inner wall surface of the moisture barrier wall is in contact with the organic material layer and the inorganic material layer, and
an angle between an entire of the inner wall surface of the moisture barrier wall and a surface of the substrate, upon which the moisture barrier wall is formed, is about 90° or less, so that an end of the organic material layer burying the display device may not extend over the moisture barrier wall.

2. The multi-display apparatus of claim 1, further comprising at least one additional organic material layer and at least one additional inorganic material layer alternately stacked.

3. The multi-display apparatus of claim 1, wherein the moisture barrier wall includes an inorganic material.

4. The multi-display apparatus of claim 3, wherein the inorganic material is one of a nitride, an oxide, and a carbide.

5. The multi-display apparatus of claim 1, wherein the moisture barrier wall includes an organic material having a moisture penetration rate of about $10^{-4}$ g·cm$^3$/day or less.

6. The multi-display apparatus of claim 5, wherein the organic material is epoxy resin.

7. The multi-display apparatus of claim 1, wherein the display device is one of a liquid crystal display, a field emission display, a plasma display panel, and an organic light-emitting diode.

8. The multi-display apparatus of claim 1, wherein the plurality of unit panels includes two unit panels each having the moisture barrier wall, and connected in a foldaway connection structure in which two ends of the unit panels contact each other.

9. The multi-display apparatus of claim 1, wherein the plurality of unit panels includes two unit panels each having the moisture barrier wall and connected in a foldaway connection structure in which two ends of the unit panels are disposed with a step difference therebetween so that display devices of the two unit panels are viewed as if they are connected with a gap equivalent to a width of one pixel.

10. The multi-display apparatus of claim 1, wherein the height of the moisture barrier wall is greater than a combined thickness of the organic material layer and the inorganic material layer.

11. The multi-display apparatus of claim 1, wherein a portion of the organic material layer is formed between the moisture barrier wall and the display device, respectively.

12. The multi-display apparatus of claim 1, wherein an outer wall surface of the moisture barrier wall is substantially coplanar with side surfaces of the substrate.

13. A method of manufacturing a unit panel for a multi-display apparatus, the method comprising:
forming a display device on a first surface of a substrate;
forming a moisture barrier wall contacting the first surface of the substrate to be spaced from an outer periphery of the display device and to expose the display device;
depositing an organic material layer within an area defined by the moisture barrier wall to a height less than a height of the moisture barrier wall, the organic material layer covering the display device and contacting an inner wall surface of the moisture barrier wall; and
depositing an inorganic material layer on substantially an entire upper surface of the organic material layer, the inorganic material layer contacting the inner wall surface of the moisture barrier wall,
wherein
an angle between an entire of the inner wall surface of the moisture barrier wall and a surface of the substrate, upon which the moisture barrier wall is formed, is about 90° or less, so that an end of the organic material layer burying the display device may not extend over the moisture barrier wall.

14. The method of claim 13, further comprising alternately depositing additional organic material layers and inorganic material layers.

15. The method of claim 13, wherein the forming the moisture barrier wall on the substrate includes forming an outer wall surface of the moisture barrier wall to be substantially coplanar with side surfaces of the substrate.

* * * * *